United States Patent
Voogel et al.

(10) Patent No.: US 9,882,562 B1
(45) Date of Patent: Jan. 30, 2018

(54) ROTATED INTEGRATED CIRCUIT DIE AND CHIP PACKAGES HAVING THE SAME

(71) Applicant: Xilinx, Inc., San Jose, CA (US)

(72) Inventors: Martin L. Voogel, Niwot, CO (US); Rafael C. Camarota, San Jose, CA (US); Henri Fraisse, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/371,472

(22) Filed: Dec. 7, 2016

(51) Int. Cl.
  *H03K 19/177* (2006.01)
  *H03K 19/00* (2006.01)
  *H01L 23/498* (2006.01)

(52) U.S. Cl.
  CPC .... *H03K 19/0008* (2013.01); *H01L 23/49811* (2013.01); *H01L 23/49838* (2013.01); *H03K 19/17728* (2013.01); *H03K 19/17744* (2013.01)

(58) Field of Classification Search
  CPC ......... H03K 19/0008; H03K 19/17728; H03K 19/17744; H01L 2224/73203; H01L 2225/06513; H01L 2225/06517; H01L 2225/0652; H01L 23/49811; H01L 23/49838
  USPC ........................................................ 326/41
  See application file for complete search history.

(56) References Cited

U.S. PATENT DOCUMENTS

| | | | | |
|---|---|---|---|---|
| 8,395,903 B1* | 3/2013 | Wu | ...................... | H01L 23/5286 174/534 |
| 2008/0143379 A1* | 6/2008 | Norman | .................. | H01L 23/50 326/39 |
| 2014/0312483 A1* | 10/2014 | Vo | ...................... | H01L 25/0652 257/691 |

* cited by examiner

*Primary Examiner* — Don Le
(74) *Attorney, Agent, or Firm* — Keith Taboada

(57) ABSTRACT

An integrated circuit (IC) die and integrated circuit (IC) chip packages having such dies are described that leverage the symmetry of the arrangement of micro-bumps to advantageously reduce interposer cost and size requirements. In one example, an integrated circuit (IC) die is provided. The IC die includes a die body, a plurality of programmable tiles disposed in the die body, and a plurality of micro-bumps disposed in the die body. The die body includes a front face connecting a bottom exterior surface and a top exterior surface. A centerline of the die body is perpendicular to the front face and bifurcates the top exterior surface. At least two of the programmable tiles are of a common type. The micro-bumps adjacent the front face and coupled to the common type of programmable tiles have a substantially symmetrical orientation relative to a symmetry axis. The symmetry axis being one of (a) collinear with the centerline of the die body, or (b) parallel to the centerline of the die body.

20 Claims, 7 Drawing Sheets

US 9,882,562 B1

ROTATED INTEGRATED CIRCUIT DIE AND CHIP PACKAGES HAVING THE SAME

TECHNICAL FIELD

Embodiments of the present invention generally relate to an integrated circuit (IC) die having micro-bumps that are arranged symmetrically, and integrated circuit chip packages having such dies.

BACKGROUND

Electronic devices, such as tablets, computers, copiers, digital cameras, smart phones, control systems and automated teller machines, among others, often employ electronic components which leverage chip package assemblies for increased functionality and higher component density. In chip packages having two or more dies arranged across an interposer of the chip package, routing between outputs on facing sides of the dies becomes complicated, often requiring complex interconnect schemes with the interposer. Such complex interconnect schemes may undesirably rob device performance. Additionally, dies arranged across the interposer usually require unique designs in order to have specific alignment between chip I/O's. As each unique design requires a separate maskset and tapeout, the fabrication costs needed to produce multiple individual dies for a single package assembly can often be undesirably high.

Therefore, a need exists for an improved integrated circuit (IC) die that addresses one or more of the problems set forth above.

SUMMARY

An integrated circuit (IC) die and integrated circuit (IC) chip packages having such dies are described that leverage a symmetrical arrangement of micro-bumps to advantageously reduce fabrication costs. In one example, an IC die includes a plurality of programmable tiles disposed in a die body. Pairs of programmable tiles of the same (i.e., common) type are coupled to micro-bumps having a substantially symmetrical orientation relative to an axis of symmetry that is collinear with or parallel to a centerline of the die body.

In another example, an integrated circuit (IC) die is provided. The IC die includes a die body, a plurality of programmable tiles disposed in the die body, and a plurality of micro-bumps disposed in the die body. The die body includes a front face connecting a bottom exterior surface and a top exterior surface. A centerline of the die body is perpendicular to the front face and bifurcates the top exterior surface. At least two of the programmable tiles are of a common type. The micro-bumps adjacent the front face and coupled to the common type of programmable tiles have a substantially symmetrical orientation relative to a symmetry axis. The symmetry axis being one of (a) collinear with the centerline of the die body, or (b) parallel to the centerline of the die body.

In another example, a chip package assembly is provided. The chip package assembly has a first integrated circuit (IC) die and second IC die disposed on an interposer. The first IC die is mounted to a top surface of the interposer in an orientation rotated 180 degrees relative to an orientation of the second IC die. A symmetry axis of the first IC die is substantially aligned with a symmetry axis of the second IC die.

In another example, a chip package assembly is provided. The chip package assembly includes a first integrated circuit (IC) die and a second IC die mounted to a top surface of an interposer. The first IC die includes die body, a plurality of programmable tiles disposed in the die body wherein at least two of the programmable tiles being of a common type, and a plurality of micro-bumps disposed in the die body. The micro-bumps adjacent a common face and coupled to the common type of programmable tiles have a substantially symmetrical orientation relative to a symmetry axis. The symmetry axis being one of (a) collinear with a centerline of the die body bifurcating the common face, or (b) parallel to the centerline of the die body. The second IC die is configured substantially identical to the first IC die and coupled to the top surface of the interposer. The second IC die is mounted to the top surface of the interposer in an orientation rotated relative to an orientation of the first IC die. The second IC die is connected by interconnects deposed in the interposer to the first IC die.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

An integrated circuit (IC) die and integrated circuit (IC) chip packages having such dies, are disclosed herein that leverage the symmetrical arrangement of micro-bumps that are coupled to programmable tile pairs to reduce routing complexity within interposers utilized with such dies in the IC chip packages. The reduce routing complexity not only advantageously reduces the interposer cost and size requirements, but also increases performance by increasing transmission speeds and reducing RC delay. For example, the symmetrical arrangement micro-bumps coupled to a pair of programmable tiles of the same type with in an IC die allows two IC dies, when in an orientation rotated relative to each other, to have their symmetrically arranged micro-bumps align, thereby allowing the routing between tiles disposed in different dies to be routed without crossing, thereby allowing interconnects in the interposer to be fabricated with less material layers while improving the performance of communication between the rotated dies. Since the rotated dies are substantially identical, they may share a single maskset and tapeout, advantageously reducing the cost of die fabrication.

Figure 1:
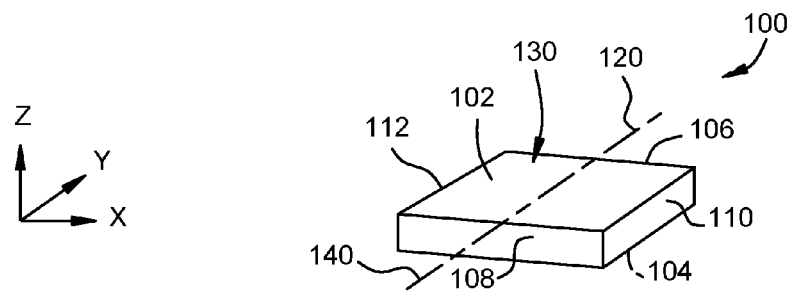
FIG. 1 is a schematic top isometric view of an integrated circuit (IC).

FIG. 1 is a schematic top isometric view of an integrated circuit (IC) die 100. The functionality of the IC die 100 is provided by solid state circuitry formed in the IC die 100, an example of which is further discussed below. The IC die 100 may be field programmable gate array die, logic device die, memory device die and the like.

Figure 2:
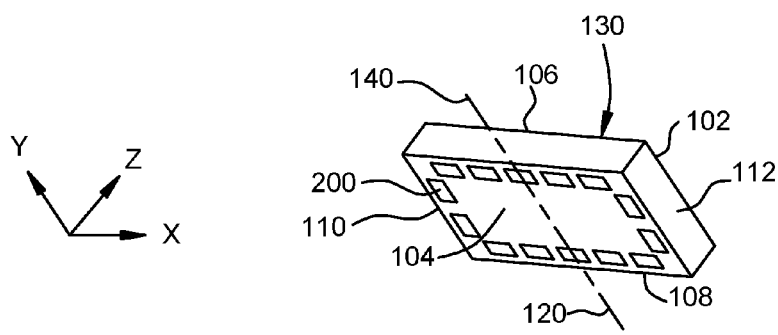
FIG. 2 is a schematic bottom isometric view of the IC die of FIG. 1.

Continuing now to refer to FIG. 1, the IC die 100 generally includes a body 130. Although the body 130 may have any suitable shape, the body 130 is shown in an exemplary rectangular form in FIG. 1. The body 130 includes exterior surfaces, illustrated as a top surface 102, a bottom surface 104, a back face 106, a front face 108, and side faces 110, 112. In the embodiment depicted in FIG. 1, the back and front faces 106, 108 are longer than the side faces 110, 112. A centerline 120 of the die body 130 is perpendicular to the back and front faces 106, 108, and bifurcates the top and bottom surfaces 102, 104. A symmetry axis 140 is collinear with, or parallel and offset from (in the direction of the sides 110, 112), the centerline 120. In the illustration of FIGS. 1 and 2, the symmetry axis 140 is collinear with the centerline 120. The micro-bumps of the IC die 100 are arranged symmetrically about the symmetry axis 140, as further discussed below.

The bottom surface 104, better illustrated in the schematic bottom isometric view of the IC die 100 in FIG. 2, includes a plurality of micro-bumps 200. The micro-bumps 200 are configured to electrically connect the circuitry of the IC die 100 to circuitry of an object to which the IC die 100 is mounted, such as an interposer as later discuss below with respect to FIG. 5. The symmetrical arrangement of the micro-bumps 200 as latter described below is primarily with respect to the symmetry axis 140.

Figure 3:
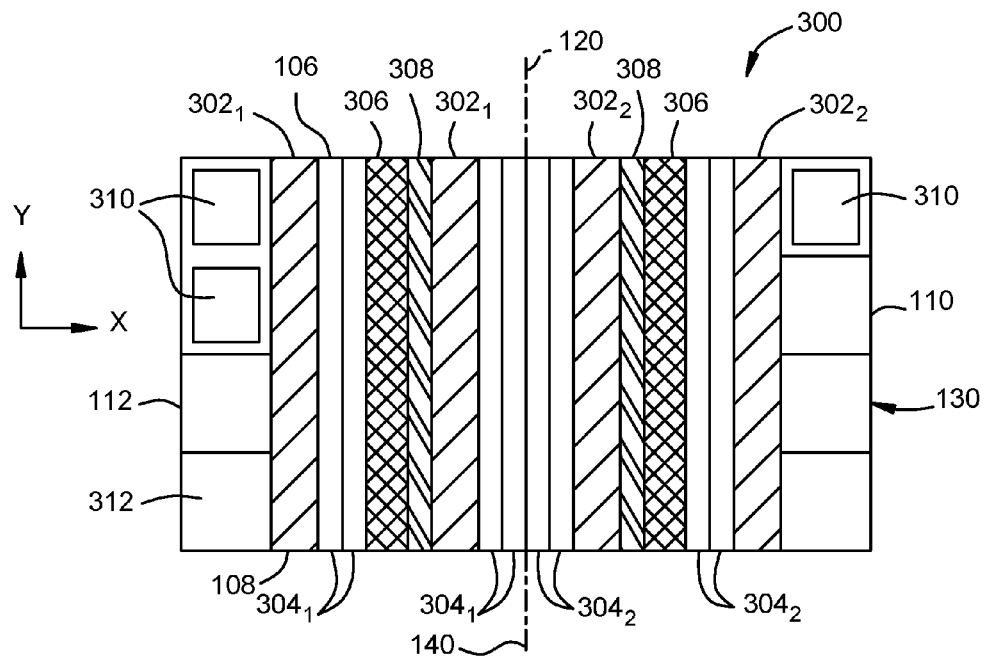
FIG. 3 is a schematic cross-sectional view of the IC die of FIG. 1.

FIG. 3 is a schematic cross-sectional view of the IC die 100 of FIG. 1 illustrating an exemplary circuitry architecture of the IC die 100. In the example of FIG. 3, the IC die 100 is configured as an FPGA die. The circuitry of the IC die 100 includes a large number of different programmable tiles (collectively tiles 300) including at least one or more of multi-gigabit transceivers ("MGTs"), configurable logic elements ("CLEs"), random access memory blocks ("BRAMs"), input/output blocks ("IOBs"), configuration and clocking logic ("CONFIG/CLOCKS"), digital signal processing blocks ("DSPs"), specialized input/output blocks ("I/O") (e.g., configuration ports and clock ports), and other programmable logic such as digital clock managers, analog-to-digital converters, system monitoring logic, and so forth. Some FPGAs also include dedicated processor blocks ("PROC").

As discussed above and further detailed below, the IC die 100 leverages the symmetrically distribution of the micro-bumps 200 coupled to pairs of programmable tiles 300 that are of the same type of tile. Stated differently, pairs of the same type of programmable tiles 300 are connected to micro-bumps 200 that have a symmetrical arrangement with respect to the symmetry axis 140. The pairs of programmable tiles 300 themselves need not also have a symmetrical arrangement with respect to the symmetry axis 140, however, embodiments having pairs of programmable tiles 300 that are also in a symmetrical arrangement with respect to the symmetry axis 140 will simplify die fabrication, along with having improved performance by virtue of simpler and shorter routing between the tiles 300 and the micro-bumps 200.

In the example depicted in FIG. 3, the IC die 100 includes at least one or more symmetrically distributed programmable tiles 300, such as one or more of a configurable logic element (CLE) tile(s) 304, Virtual Network on chip (VNoc) tile(s) 302 or BRAM tile(s). For example, the IC die 100 may include at least one or more symmetrically distributed configurable logic element (CLE) tile(s) 304. In the example depicted in FIG. 3, two CLE tiles $304_1$, $304_2$ are shown, although more may be present. The CLE tiles 304 are the main resources for implementing general-purpose combinatorial and sequential circuits of the IC die 100. Each CLE tile 304 is made up of the logic elements, which are grouped together in a slice, along with the interconnect routing resources to connect the logic elements. Examples of FPGA dies having CLE tiles are available from Xilinx, Inc., of San Jose, Calif.

Exemplary circuit elements of each CLE tile 304 provides high-performance, low-power programmable logic and may include one or more of logical function generators such as look up tables (LUTs), storage elements, distributed memory and shift register logic (SRL), and multiplexers, and carry logic. The storage elements may include a description of and controls for the latches and flip-flops contained in the CLE tile 304. Dedicated storage elements can be configured as flip-flops or latches with flexible control signals. The carry logic may include dedicated gates that can be cascaded to implement efficient arithmetic functions. The above is just one example of many circuit configurations for a CLE tile that may be utilized with the IC die 100.

The CLE tiles 304 are arranged in columns throughout the body 130 of the IC dies 100. The CLE tiles 304 have substantially symmetrical positional distribution about the symmetry axis 140 disposed through of the die body 130 that is perpendicular to the back and front faces 106, 108, and splits the top and bottom surfaces 102, 104. Thus in one example, the symmetry axis 140 may be described as the centerline or midpoint of the palindrome distribution of programmable tiles 300 comprising the IC die 100. In one embodiment the symmetry axis 140 is the centerline 120 of the body 130. For example, the first and second CLE tiles $304_1$, $304_2$ are disposed a substantially equal distance from either side of the centerline 120 of the body 130. As used herein, a substantially equal distance means that the distances are within plus or minus 200 microns (μm) of each other. Although two CLE tiles $304_1$, $304_2$ are illustrated in FIG. 3, any number of CLE tiles 304 maybe utilized as along as the substantially symmetrical positional distribution about the symmetry axis 140 in one example is maintained. A symmetrical positional distribution may include one CLE tile 304 disposed on the symmetry axis 140, which in this example is also the centerline 120 of the body 130.

In another embodiment, the symmetry axis 140 to which the CLE tiles 304 have substantially symmetrical positional distribution is disposed through of the die body 130 perpendicular to the back and front faces 106, 108, and splits the top and bottom surfaces 102, 104. In this example, the symmetry axis 140 is parallel to and offset from the centerline 120, while still having the CLE tiles 304 distributed in substantially symmetrical positional distribution about the symmetry axis 140.

Figure 5:
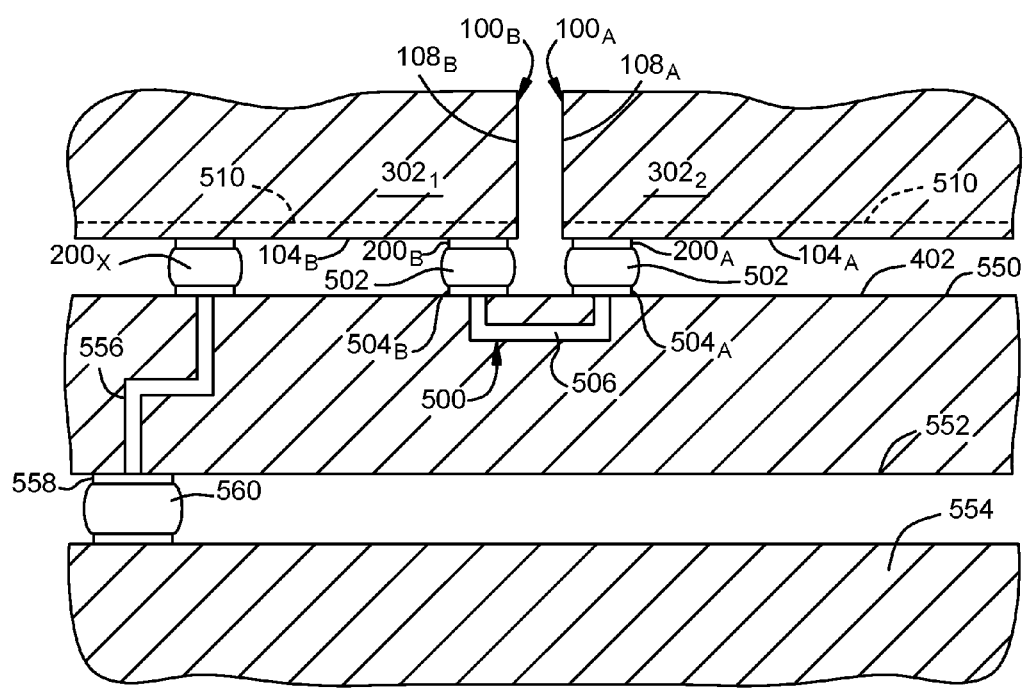
FIG. 5 is a partial cross-sectional view of the IC dies of the chip package assembly of FIG. 4 illustrating an interconnect between the IC dies through an interposer of the chip package assembly.

As discussed above, the IC die 100 may also include at least one or more symmetrically distributed Virtual Network on chip (VNoc) tile(s) 302. In the example depicted in FIG. 3, two VNoc tiles $302_1$, $302_2$ are shown, although more may be present. The VNoc tiles 302 having inputs connected outputs of other tiles, such as the CLE tiles 304, among others, and outputs connected at least to the micro-bumps 200 disposed in the bottom surface 104 of the die body 130. As such, the micro-bumps 200 that are coupled to the tiles 302, 304 are also disposed in an arrangement that is substantially symmetrical orientation relative to the symmetry axis 140 that is the same as, or offset and parallel to, the centerline 120 of the die body 130, as discussed above. For example, as shown in FIG. 5, opposite ends of the circuitry comprising the CLE tiles 304 terminate at micro-bumps $200_A$, $200_B$ that may be connected via solder balls 502 to an interconnect substrate 402, such as a package substrate or interposer, of an integrated circuit chip package assembly. The discussion of FIG. 5 resume further below with additional description of the chip package assembly.

Continuing to refer to FIG. 3, each VNoc tile 302 comprises switching circuitry and logic that enable routers to route signals from the adjacent tiles (such as CLE tiles) of the IC die 100 to another IC die within a chip package assembly. The switching circuitry of the VNoc tiles 302 may include at least one or more of multiplexers, buffers, crossbar switches and arbiters. The above is just one example of many circuit configurations for a VNoc tile may be utilized with the IC die 100. Examples of FPGA dies having VNoc tiles are available from Xilinx, Inc., of San Jose, Calif.

Similar to the CLE tiles 304, the VNoc tiles 302 are arranged in columns throughout the body 130 of the IC dies 100. The VNoc tiles 302 have substantially symmetrical positional distribution about the symmetry axis 140 that is the same as, or parallel and offset from, the centerline 120 of the body 130, as discussed above. For example, the first and second VNoc tiles $302_1$, $302_2$ are disposed a substantially equal distance from either side of the symmetry axis 140, which in this example is also the centerline 120 of the body 130. As discussed above, a substantially equal distance means that the distances are within plus or minus 200 microns (μm) of each other. Although two VNoc tiles $302_1$, $302_2$ are illustrated in FIG. 3, any number of VNoc tiles 302 maybe utilized as along as the substantially symmetrical positional distribution about the symmetry axis 140 is maintained. A symmetrical positional distribution may include one VNoc tile 302 disposed on the symmetry axis 140, which as discussed above, may be collinear or parallel with the centerline 120 of the body 130.

In another embodiment wherein the symmetry axis 140 is parallel to and offset from the centerline 120, two VNoc tiles 302 may distributed in substantially symmetrical positional distribution about the symmetry axis 140. Optionally, the symmetrical positional distribution may include one VNoc tile 302 disposed on the symmetry axis 140 of the body 130.

The IC die 100 may also include one or more other tiles generically referred to as miscellaneous tiles 306, 308. The miscellaneous tiles 306, 308 may include one or more of MGT tiles, the random access memory blocks BRAM tiles, 10B tiles, CONFIG/CLOCKS tiles, and DSP tiles. Such miscellaneous tiles 306, 308 are conventionally known. The miscellaneous tiles 306, 308 may optionally also be substantially symmetrical about the symmetry axis 140. The location of any of the miscellaneous tiles 306, 308 relative to the VNoc tiles 302 and CLE tiles 304 may vary as desired. For example, the relative location of the tiles within the die body 130 shown in FIG. 3 is purely for illustrative purposes, and other locations of one type of tiles relative to another type of tile may be utilized as long as the symmetrical orientation of the VNoc tiles 302 and CLE tiles 304 is maintained.

The IC die 100 may also include input/output (I/O) blocks 310 and power management controller (PMC) blocks 312, among others. One or both of the I/O and PMC blocks 310, 312 may optionally be substantially symmetrical about the symmetry axis 140 of the die body 130 as well.

As discussed above, the substantially symmetrical positional distribution of the VNoc tiles 302 and the CLE tiles 304 enable the two IC dies 100, when in an orientation rotated 180 degrees relative to each other, to have their VNoc and CLE tiles 302, 304 align, thereby allowing the routing between tiles on different dies to be routed without crossing, thereby allowing interconnects in an interposer of a chip package comprising the dies 100 to be fabricated with less material layers while improving the performance of communication between the rotated dies 100. Thus, any implementation of a chip package assembly having two dies 100 rotated 180 degrees and having their symmetry axes 140, such as the centerlines 120, aligned will benefit from the configurations described herein. Examples of chip package assemblies having two dies 100 having an orientation rotated relative to each other while having the symmetry axes 140 of the dies 100 substantially align (e.g., within plus or minus 200 μm) are illustrated in FIGS. 4 and 7-9. It is noted that rotated IC dies that are not substantially aligned will benefit from the teachings herein, but not to the same extent as rotated IC dies that are substantially aligned. The IC dies 100 of the chip package assemblies may have a rotation between slightly greater than zero to about 180 degrees. In some embodiments, chip package assemblies having IC dies 100 rotation about 180 degrees may enjoy many of the advantages described herein.

Figure 4:
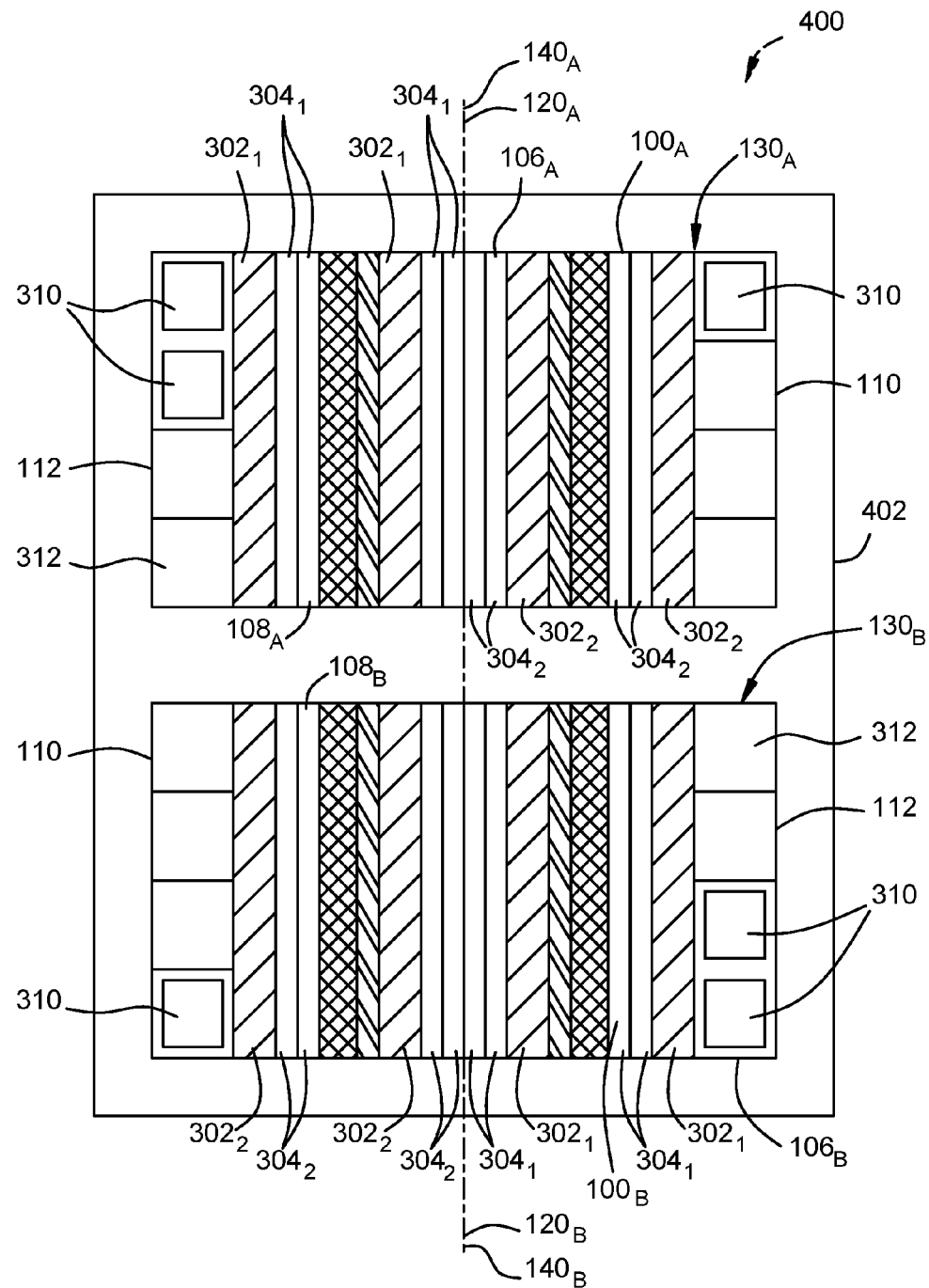
FIG. 4 is a schematic top view of a chip package assembly having two IC dies disposed thereon, the IC dies shown schematically in cross-section.

FIG. 4 is a schematic top view of a chip package assembly 400 having two IC dies $100_A$, $100_B$ mounted on an interconnect substrate 402. The IC dies $100_A$, $100_B$ shown schematically in cross-section and have a construction that is substantially identical. For example, the IC dies $100_A$, $100_B$ may be fabricated utilizing a single maskset.

The interconnect substrate 402 may be a package substrate that includes or does not include an interposer. In the examples described herein, the interconnect substrate 402 is shown and described as an interposer, and will be referred to hereinafter as interposer 402. However, package substrate that includes or does not include an interposer may be alternatively be utilized in each example wherever the interposer 402 is referenced.

As conventionally known, the interposer 402 includes one or more metalization layers that form circuitry for interconnecting the IC dies $100_A$, $100_B$ mounted on a top surface of the interposer 402. The interposer 402 also includes vias for routing signals from the IC dies $100_A$, $100_B$ to micro-bumps disposed on a bottom surface of the interposer 402. The micro-bumps disposed on a bottom surface of the interposer 402 are configured to allow the interposer 402 to be mounted to a package substrate (not shown) via controlled collapse chip connection (i.e., C4 solder balls) and underfill in a conventional or other suitable manner. The package substrate is mounted to a printed circuit board (PCB) utilizing solder balls to enable communication between the PCB and the IC dies $100_A$, $100_B$ through the package substrate and interposer 402.

The subscript "A" and "B" as used herein as a suffix to the dies 100 signifies that the die body 130 of the subscript "A" die (e.g., die $100_A$) is rotated 180 degrees relative to the die body 130 of the subscript "B" die (e.g., die $100_B$). In the example depicted in FIG. 4, the IC die $100_A$ has an orientation is the rotated about 180 degrees relative to an orientation of the IC die $100_B$ such that the same face of the dies 100, here the back faces $108_A$, $108_B$, are facing each other. The IC die $100_A$ has a centerline $120_A$ that is collinear with a symmetry axis $140_A$, while the IC die $100_B$ has a centerline $120_B$ that is collinear with a symmetry axis $140_B$. In the embodiment depicted in FIG. 4, the symmetry axes $140_{A,B}$, and thus, the centerlines $120_{A,B}$ of the IC dies $100_{A,B}$ are substantially aligned. In other embodiments, the symmetry axes $140_{A,B}$ but not the centerlines $120_{A,B}$ of the IC dies $100_{A,B}$ are substantially aligned. As utilized herein, the term "substantially aligned" or alternatively "substantial alignment" means that the alignment of the symmetry axis 140 (or other object being referred to as substantially aligned or in substantial alignment) is co-linear or within plus or minus 200 µm. The 180 degree rotation of the IC dies 100 advantageously results in the VNoc tile $302_1$ of the IC die $100_A$ being substantially aligned with the VNoc tile $302_2$ of the IC die $100_B$, and the VNoc tile $302_2$ of the IC die $100_A$ being substantially aligned with the VNoc tile $302_1$ of the IC die $100_B$. Similarly, The 180 degree rotation of the IC dies 100 advantageously results in the CLE tile $304_1$ of the IC die $100_A$ being substantially aligned with the CLE tile $304_2$ of the IC die $100_B$, and the VNoc tile $302_2$ of the IC die $100_A$ being substantially aligned with the VNoc tile $302_1$ of the IC die $100_B$. With the VNoc tiles 302 and CLE tiles 304 being in substantial alignment, the routing between the same type of tiles on adjacent dies 100 through the interposer 402 is simpler, less expensive and enables better performance of the solid state circuitry within the dies $100_A$, $100_B$, thereby increasing device (i.e., the chip package assembly 400) performance while reducing cost.

FIG. 5 is a partial cross-sectional view of the IC dies $100_A$, $100_B$ of the chip package assembly 400 of FIG. 4 illustrating an interconnect 500 between the IC dies $100_A$, $100_B$ through the interposer 402 of the chip package assembly 400. Also shown in FIG. 5 is a printed circuit board (PCB) 554 coupled to a bottom surface 552 of the interposer 402. Interconnect circuitry 556 is disposed through the interposer 402 to electrically couple the circuitry of the PCB 554 to the circuitry of the IC die $100_B$. The interconnect circuitry 556 is coupled to the circuitry of the IC die $100_B$ via a micro-bump $200_X$. The interconnect circuitry 556 is coupled to the circuitry of the PCB 554 via a contact pad 558 and solder ball 560.

A micro-bump $200_A$ of the IC die $100_A$ is coupled to a micro-bump $504_A$ formed on a contact pad 558 disposed on the top surface of the interposer 402. A micro-bump $200_B$ of the IC die $100_B$ that is adjacent the IC die $100_A$ is coupled to a micro-bump $504_B$ formed on the top surface of the interposer 402.

The micro-bump $504_A$ and the micro-bump $504_B$ are connected by a metalization routing 506 formed within the interposer 402 that defines the interconnect 500. As the micro-bump $504_A$ and the micro-bump $504_B$ are substantially aligned, the metalization routing 506 is very short, advantageously promoting fast communication speeds between the adjacent IC dies $100_A$, $100_B$.

The micro-bump $200_A$ may be coupled to the programmable tile 300 directly above (i.e., immediately adjacent) the micro-bump $200_A$, here shown as CLE tile $302_A$, or to another one of the programmable tiles 300 laterally spaced from the micro-bump $200_A$. For example, a programmable tiles 300 that is not directly above the micro-bump $200_A$ may be coupled to the micro-bump $200_A$ via a metal interconnect layer 510 (shown in phantom) formed in the IC die $100_A$ as conventionally known.

Moreover, the substantially symmetrical layout of the micro-bumps 200 of the IC dies 100, and hence the substantially symmetrical layout of the micro-bumps 504 of the interposer 402 allows rotated IC dies $100_A$, $100_B$ of the chip package assembly 400 to be interconnected through the interposer 402 in the above manner which promotes fast performance of the chip package assembly 400. Such an arrangement is schematically depicted in FIG. 6.

Figure 6:
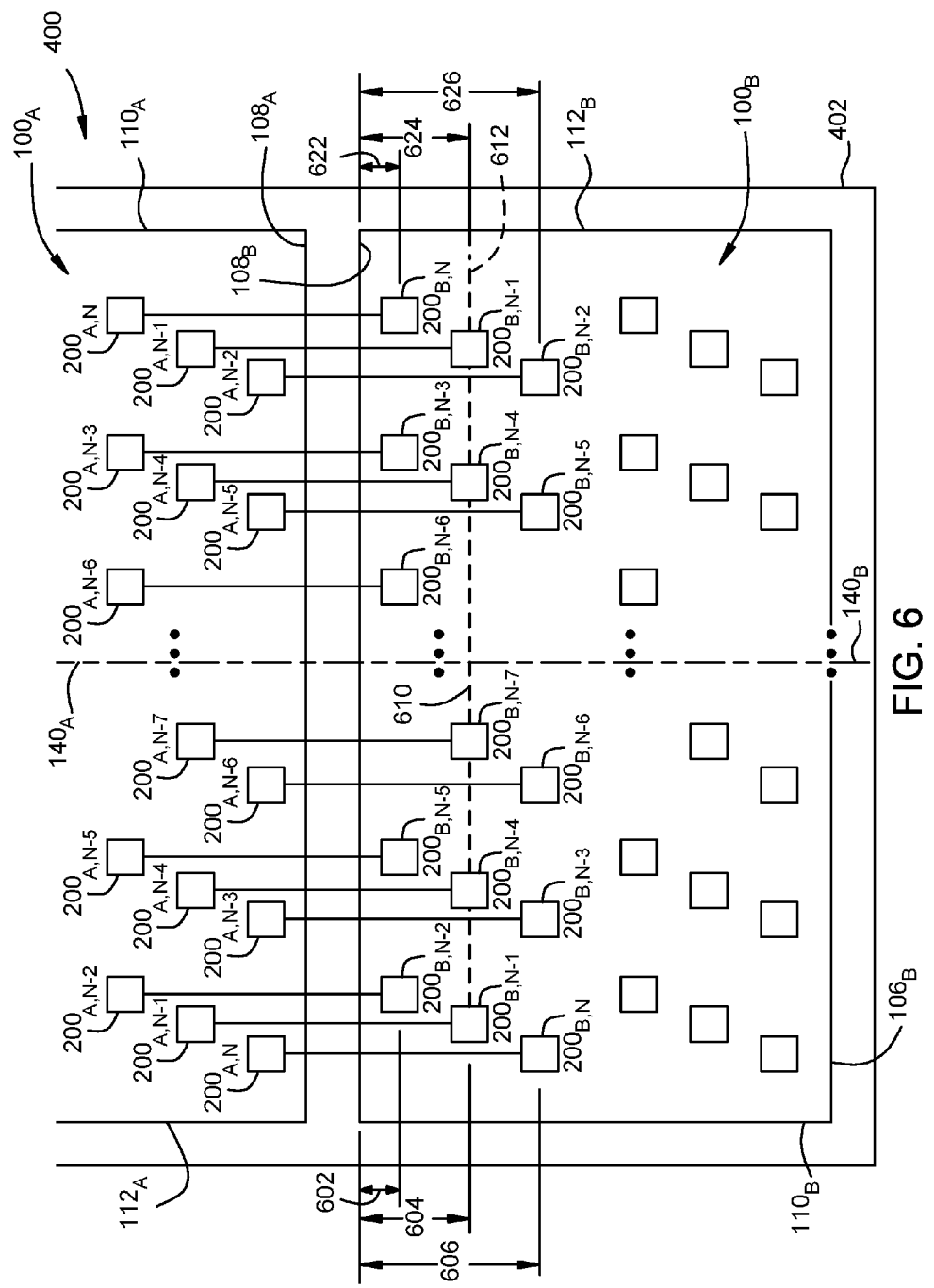
FIG. 6 schematically illustrates a series of interconnects disposed between the adjacent sides of the IC dies of the chip package assembly illustrated in FIG. 4.

FIG. 6 schematically illustrates a series of interconnects $500_i$ disposed on an interposer 402 between the adjacent sides $108_A$, $108_B$ of the IC dies $100_A$, $100_B$ of the chip package assembly 400 illustrated in FIG. 4. The subscript i of the interconnect 500 is a positive integer. In FIG. 6, the micro-bumps $200_{B,N}$ are connected as shown in FIG. 5 to the various programmable tiles 300 (not shown in FIG. 6), such as CLE and VNoc tiles 302, 304, of the IC die $100_B$ while micro-bumps $200_{A,N}$ are connected to the programmable tiles 300 of the IC die $100_A$ that is adjacent the IC die $100_B$. The subscript A and B in the reference numeral of the micro-bump 200 designates which IC die 100 the micro-bump 200 part of, while the subscript N indicates sequentially how far the micro-bumps 200 is from the symmetry axis 140. The micro-bump $200_N$, when N=1, resides on or immediately adjacent to the symmetry axis 140. The micro-bumps $200_N$, when N=the largest Nth number, is positioned farthest from the symmetry axis 140. Micro-bumps $200_N$ having the same subscript N are connected to the same or functionally equivalent type of programmable tile 300, thus defining an intra-die pair of micro-bumps $200_N$ wherein each micro-bumps $200_N$ is symmetrical to the symmetry axis 140 by being disposed at the same distance from the symmetry axis 140. Micro-bumps $200_{A/B,N}$ residing on adjacent rotated IC dies $100_{A,B}$ that have the same subscript N are coupled to the same or functionally equivalent type of programmable tile 300, for example both to one of the CLE tiles 302, thus forming an inter-die pair of micro-bumps $200_N$, wherein the pair is connected through one of the interconnects 500; (i.e., through one of the metalization routings 506) formed below the surface of the interposer 402. Accordingly, programmable tiles 300 coupled by the inter-die pair of micro-bumps $200_N$ are tolerant to the exchanged signals to enable functionality of the chip package assembly 400. For example as illustrated in FIG. 6, only micro-bumps $200_N$ coupled to the same type of programmable tile 300 are coupled together. For example, micro-bump $200_{A,1}$ is connected to particular type of programmable tile 300, for example a CLE tile $302_A$ and is connected through the interconnect $500_1$ to micro-bump $200_{B,1}$ of the neighboring adjacent IC die $100_B$, wherein the micro-bump $200_{B,1}$ is connected to same type of programmable tile 300, i.e., CLE tile $302_B$ of the IC die $100_B$.

In one example, as shown by the micro-bumps $200_{A,N}$, $200_{B,N}$ illustrated in FIG. 6, the interconnects $500_1$ and associated micro-bumps $200_{A,N}$, $200_{B,N}$ maybe arranged in an order sequentially identical to an order of the type of programmable tiles 300, such as the CLE and VNoc tiles 302, 304 and the like, are arranged in the die bodies 130 as shown in FIG. 4. Accordingly, the connection intra-die pairs of micro-bumps $200_{A/B,N}$ maybe arranged in an order sequentially identical to an order that types of programmable tiles 300, for example the CLE and VNoc tiles 302, 304, are arranged in the die bodies 130. As the order of intra-die pairs of micro-bumps $200_{A/B,N}$ are sequentially identical in each of the IC dies $100_{A,B}$ relative to the symmetry axes 140 of the bodies 130 (as shown in FIG. 4) and are substantially aligned, the interconnects $500_i$ can be run substantially in parallel and without crossing between adjacent IC dies $100_A$, $100_B$ with minimal metalization of the interposer 402, thus allowing for a less expensive and less complex interposer 402, while improving the performance of the chip package assembly 400.

In yet another example, the sequential order of the programmable tiles 300 may different than the symmetrical order of the intra-die pairs of micro-bumps $200_{A/B,N}$ defined across the dies IC dies $100_{A,B}$ by utilizing the metal interconnect layer 510. However, also long the symmetry of the intra-die pairs of micro-bumps $200_{A/B,N}$ relative to the symmetry axes 140 is maintained, the advantage of utilizing the rotated IC dies 100 may be realized. Thus in one example, an order of the intra-die pairs of micro-bumps $200_{A/B,N}$ is symmetrical relative to the symmetry axes 140 while an order of the types of programming tiles 300 within the IC die 100 is not.

In another advantage that may be realized in certain embodiments is that by maintaining the metalization routing 506 short and substantially equal in length between different inter-die pairs of micro-bumps $200_{A/B,N}$, uniformly fast communication speeds between the adjacent IC dies $100_A$, $100_B$ may be advantageously achieved. For example, a distance between micro-bump $200_{A,1}$, and micro-bump $200_{B,1}$ is substantially equal to a distance between micro-bump $200_{A,2}$, and micro-bump $200_{B,2}$, and is also substantially equal to a distance between micro-bump $200_{A,3}$, and micro-bump $200_{B,3}$ and so on. As the micro-bumps 200 may be nested to accommodate a high density of interconnections between dies, an average distance between micro-bumps 200 along a common face (for example the front face 108) of the IC die 100 is substantially equal, and thus, symmetrical, on either side of the symmetry axis 140 of the IC die 100. Defined in a different manner, an average distance 612 (shown in phantom) may be an average of distances 602, 604, 606 of the micro-bumps $200_{A,N}$, $200_{A,N-1}$, $200_{A,N-2}$, (and so on) disposed on a common side of the symmetry axis 140 from a common face (the front face 108 in this example) of the IC die $100_B$. An average distance 612 (shown in phantom) may be an average of distances 622, 624, 626 of the micro-bumps $200_{A,N}$, $200_{A,N-1}$, $200_{A,N-2}$, (and so on) from same face (the front face 108) of the micro-bumps 200 that are disposed on an opposite side of the symmetry axis 140, such that the average distance 610 is substantially equal to the average distance 612. In order to achieve the symmetry of average distances 610, 612, an additional order (i.e., second order) of symmetry is present between the micro-bumps $200_{A,N}$ residing along a common face on opposite sides of the symmetry axis 140. The second order of symmetry is that distances from the common face of micro-bumps 200 having a common subscript N but residing on opposite sides of the symmetry axis 140, even if different, have an average distance to the common face that is substantially equal to the average distances 610, 612. For example, the distances 602, 622 are different, but the average of distance 602 plus distance 622 is substantially equal to average distance 610, 612. Thus, the intra-die orientation of micro-bumps 200 having a common subscript N but residing on opposite sides of the symmetry axis 140 have a second order of symmetry about the average distance of those micro-bumps 200 to the adjacent common face of the IC die 100.

While the chip package assembly 400 described above has two IC dies $100_A$, $100_B$ that have an orientation rotated 180 degrees relative to each other, other chip package assemblies may be configured with two IC dies $100_A$, $100_B$ that have three or more IC dies. Additionally, chip package assemblies may also be configured with at least two IC dies $100_A$, $100_B$, while additionally having other integrated circuit (IC) dies, such as memory dies among others, disposed on a common interposer. Although some examples of other chip package assemblies having at least two rotated IC dies $100_A$, $100_B$ are described below with reference to FIGS. 7-9, other configurations are contemplated.

Figure 7:
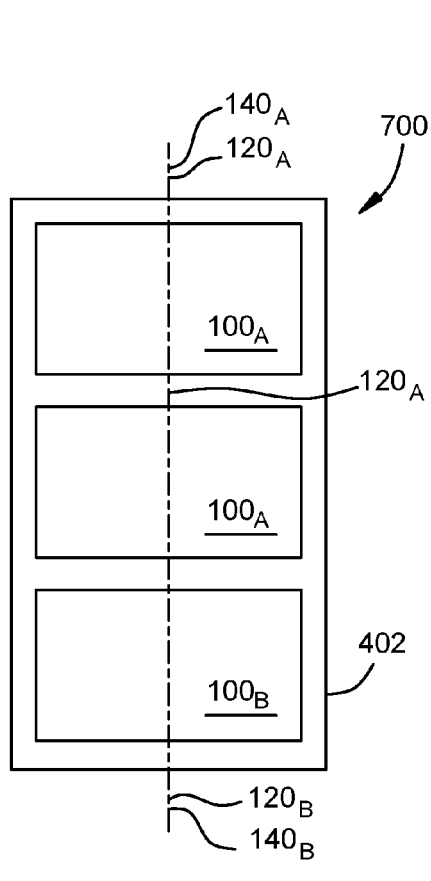
FIG. 7 is a schematic top view of a chip package assembly having three IC dies disposed thereon.

FIG. 7 is a schematic top view of another chip package assembly 700 having three IC dies 100 disposed on an interposer 402. At least two of the IC dies $100_A$, $100_B$ are shown having an orientation rotated 180 degrees with their symmetry axes $140_{A,B}$ substantially aligned. The IC dies $100_A$, $100_B$ have their CLE and VNoc tiles 302, 304 substantially aligned as described above with reference to FIGS. 3-6. Although the symmetry axes $140_{A,B}$ are shown in FIG. 7 as being collinear with the centerlines $120_{A,B}$ of the other two IC dies 100 of the chip package assembly 700, in other examples, the symmetry axes $140_{A,B}$ may alternatively be offset and parallel to the centerlines $120_{A,B}$.

A third IC die $100_A$ is also disposed on the interposer 402 and has a symmetry axis $140_A$ substantially aligned with the symmetry axes $140_{A,B}$ of the other IC dies $100_A$, $100_B$. Although the third IC die $100_A$ is shown adjacent only the other IC die $100_A$, the third IC die $100_A$ may alternatively be disposed between the other IC die $100_A$ and the rotated IC die $100_B$.

Because the symmetry axis $140_A$ of the third IC die $100_A$ is aligned with the symmetry axes $140_{A,B}$ of the other IC dies 100, the CLE and VNoc tiles 302, 304 of the third IC die $100_A$ is also substantially aligned with the CLE and VNoc tiles 302, 304 of the IC dies $100_A$, $100_B$. As such, the interconnects 500 (as illustrated in FIGS. 5-6) between the three IC dies $100_A$, $100_A$, $100_B$ are routed between tiles formed in the different dies without crossing with minimal length and complexity, thereby allowing interconnects 500 in the interposer to be fabricated with less material layers while improving the performance of communication between the IC dies $100_A$, $100_A$, $100_B$. Additionally, since the three IC dies $100_A$, $100_A$, $100_B$ are substantially identical, they may share a single maskset and tapeout, advantageously reducing the cost of fabrication.

Figure 8:
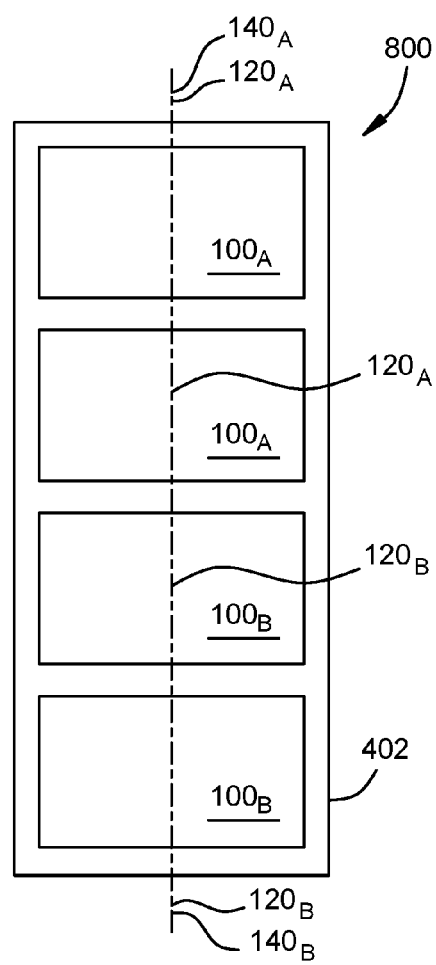
FIG. 8 is a schematic top view of another chip package assembly having four IC dies disposed thereon.

FIG. 8 is a schematic top view of another chip package assembly 800 having four IC dies 100 disposed on an interposer 402. The IC dies $100_A$ are shown having an orientation rotated 180 degrees with their symmetry axes $140_{A,B}$ substantially aligned with the two IC dies $100_B$. The IC dies $100_A$, $100_B$ have at least the inter-die micro-bumps $200_{A,B}$ and optionally also the associated programmable tiles 300, such as CLE and VNoc tiles 302, 304, substantially aligned as described above with reference to FIGS. 3-6. Although the symmetry axes 140 are shown in FIG. 8 as being collinear with the centerlines 120 of the IC dies 100 of the chip package assembly 800, in other examples, the symmetry axes $140_{A,B}$ may alternatively be offset and parallel to the centerlines $120_{A,B}$.

Although the two IC dies $100_A$ are shown disposed on the interposer 402 adjacent each other, the two IC dies $100_A$ may be separated by one or both of the IC dies $100_B$. Additionally, one or more other IC dies may be disposed between one or more of the IC dies 100.

Because the symmetry axis 140 of the IC dies 100 are substantially aligned, the micro-bumps 200 as depicted in FIGS. 5 and 6 coupling same type pairs of programmable tile 300 are also substantially aligned. In some embodiments wherein same type pairs of the programmable tiles 300 are also symmetrical about the symmetry axis 140, routing between the micro-bumps 200 and tiles 300, is simpler and shorting, thus improving the cost and performance of the IC die 100. For example, the CLE and VNoc tiles 302, 304 of all the IC dies 100 may also substantially aligned. As such, the interconnects 500 (as illustrated in FIGS. 5-6) between the four IC dies $100_A$, $100_A$, $100_B$, $100_B$ are routed between tiles formed in the different dies without crossing with minimal length and complexity, thereby allowing interconnects 500 in the interposer to be fabricated with less material layers while improving the performance of communication between the IC dies $100_A$, $100_A$, $100_B$, $100_B$. Additionally, since the four IC dies $100_A$, $100_A$, $100_B$, $100_B$ are substantially identical, they may share a single maskset and tapeout, advantageously reducing the cost of fabrication.

Figure 9:
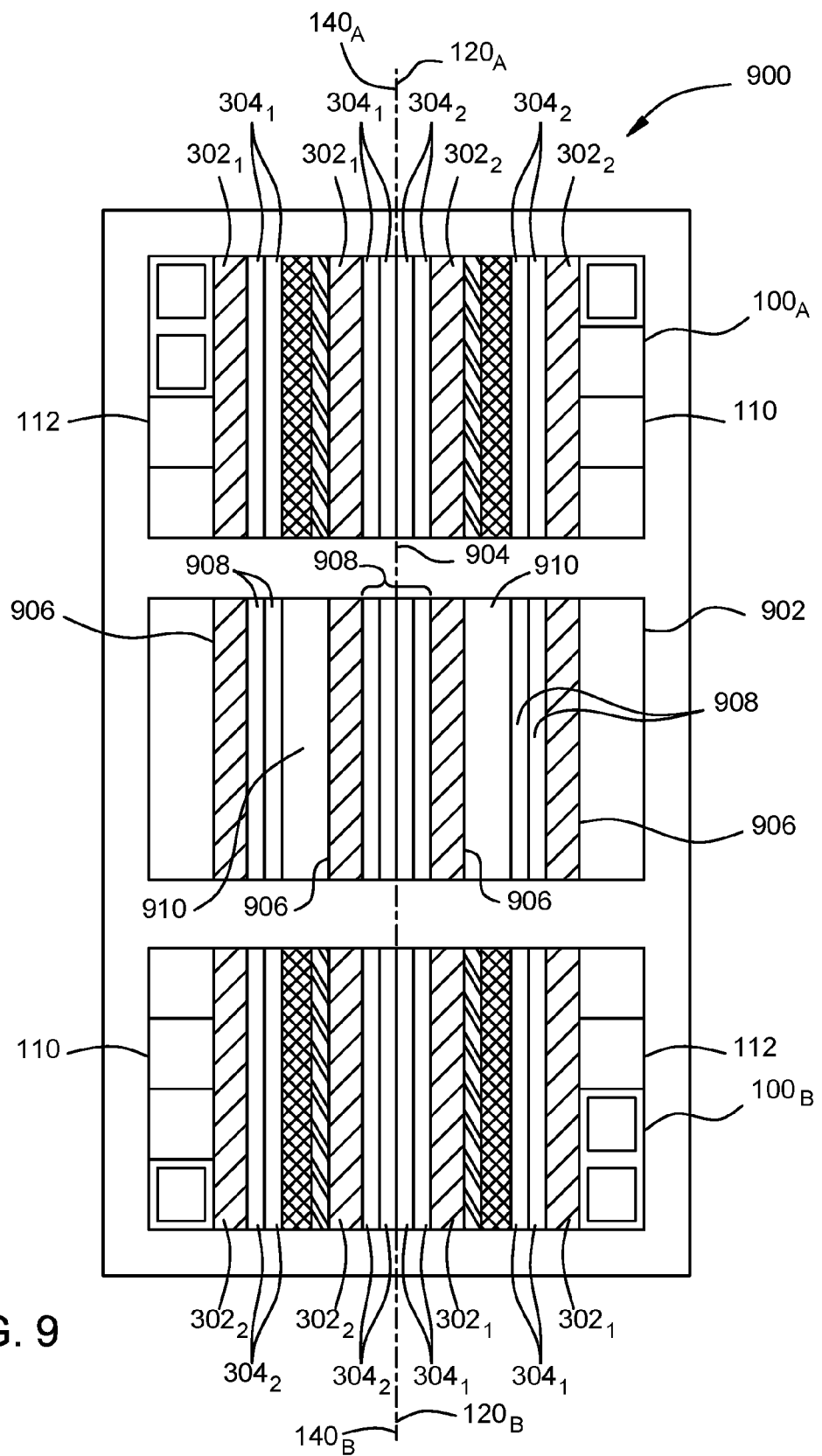
FIG. 9 is a schematic top view of yet another chip package assembly having three integrated circuit (IC) dies disposed thereon, the IC dies shown schematically in cross-section.

FIG. 9 is a schematic top view of yet another chip package assembly 900 having three IC dies $100_A$, $100_B$, 902 disposed on an interposer 402. The IC dies $100_A$, $100_B$, 902 shown schematically in cross-section. The two of the IC dies $100_A$, $100_B$ have a rotated, substantially aligned orientation of at least the inter-die micro-bumps $200_{A,B}$ and optionally also the associated programmable tiles 300, such as described above.

The IC die 902, which may be an FPGA die, logic device die, memory device die and the like, may be positioned between the IC dies $100_A$, $100_B$. Additionally, the IC die 902 does not share the same configuration as the IC dies $100_A$, $100_B$. Although the IC die 902 is shown having a centerline 904 aligned with the centerlines 120 of the IC dies $100_A$, $100_B$, the centerline 904 of the IC die 902 does not have to align with the centerlines 120 (or symmetry axes 140) of the IC dies $100_A$, $100_B$.

The IC die 902 includes CLE tiles 906, VNoc tiles 908, and miscellaneous tiles 910 that may be substantially similar to the CLE tiles 302, VNoc tiles 304, and miscellaneous tiles 306, 308 of the IC dies $100_A$, $100_B$. The IC die 902 is mounted to the interposer 402 in a position that aligns at least the inter-die micro-bumps 200 of the IC die 902 with the micro-bumps $200_{A,B}$ of the IC dies $100_{A,B}$, and optionally also substantially aligns the associated programmable tiles 300, such as the CLE tiles 906, VNoc tiles 908 of the IC die 902 with the CLE tiles 302, VNoc tiles 304 of the IC dies $100_A$, $100_B$. In embodiments wherein the symmetry axes 140 of the IC dies $100_A$, $100_B$, 902 are substantially aligned, the CLE tiles 906, VNoc tiles 908 of the IC die 902 are arranged in a substantially symmetrical orientation about the centerline 120 of the IC die 902.

As the inter-die micro-bumps 200 of the IC die 902 are substantially aligned with the inter-die micro-bumps $200_{A,B}$ of the IC dies $100_A$, $100_B$, the interconnects between the IC dies $100_A$, $100_A$, 902 may be configured with minimal complexity as described above. For example, the interconnects between the IC die $100_A$ and the IC die 902, along with the interconnects between the IC die $100_A$ and the IC die 902, may be formed with minimal complexity and identically as the interconnects 500 described above connecting the CLE tiles 302, VNoc tiles 304 of the IC dies $100_A$, $100_B$. Thus, the orientation of the IC dies $100_A$, $100_A$, 902 on the interposer 402 and alignment between the CLE tiles 302, 906 VNoc tiles 304, 908 allows the routings between CLE and VNoc tiles formed in the different dies to be formed without crossing with minimal length and complexity, thereby allowing interconnects 500 in the interposer to be fabricated with less material layers while improving the performance of communication between the IC dies $100_A$, $100_A$, 902. Additionally, since two of the IC dies $100_A$, $100_B$ are substantially identical, they may share a single maskset and tapeout, advantageously reducing the cost of fabrication.

Figure 10:
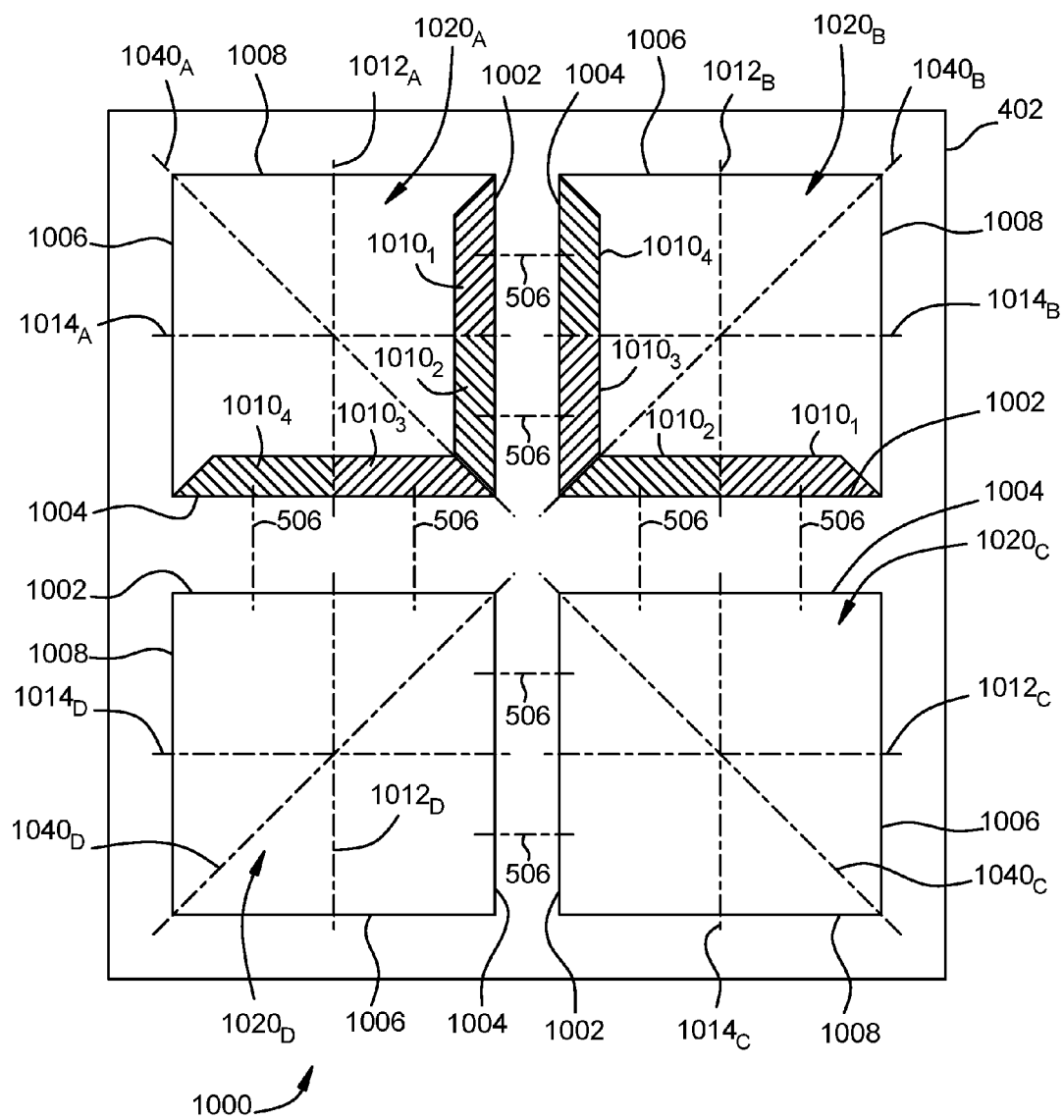
FIG. 10 is a schematic top view of another chip package assembly having multiple IC dies disposed therein.

FIG. 10 is a schematic top view of another chip package assembly 1000 having multiple IC dies 1020 disposed therein. The chip package assembly 1000 includes a interposer 402 on which the IC dies 1020 are mounted in a rotated orientation. The functionality of the IC die 1020 is provided by solid state circuitry formed in the IC die 1020, similar to that described above with reference to the IC die 100. The IC die 1020 may be field programmable gate array die, logic device die, memory device die and the like. In the example depicted in FIG. 10, four IC dies 1020 are illustrated, with the subscript A, B, C and D designated a particular IC die.

The IC die 1020 generally includes a body. Although the body may have any suitable shape, the body is shown in an exemplary rectangular form in FIG. 10. The body includes exterior surfaces, illustrated as a first face 1002, a second face 1004, a third face 1006, and a fourth face 1008. The first and second faces 1002, 1004 generally correspond to the back and front faces 106, 108 of the IC die 100 described above, except in that the faces 1002, 1004 are adjacent each other.

A first centerline 1012 of the die body 130 is perpendicular to and bifurcates the faces 1004, 1008, while a second centerline 1014 of the die body is perpendicular to and bifurcates the faces 1002, 1006. The centerlines 1012, 1014 intersect at the center of the die body. A symmetry axis 1040 extends between the corner defined the faces 1002, 1004 and the corner defined by faces 1006, 1008. The symmetry axis 1040 intersects the centerlines 1012, 1014 at the center of the die body. The rotational orientation of the IC die 1020 is made about an axis (not shown) that passes perpendicularly to the centerlines 1012, 1014 at the center of the die body.

Along each of the faces 1002, 1004 are micro-bump regions 1010. Micro-bumps 200 are arranged on the bottom surface of the IC die 1020 in the regions 1010 generally as described with reference to FIGS. 2 and 5-6, as further clarified below. Within a single IC die 1020, the micro-bump regions 1010 along the first face 1002 are symmetrical with respect to the micro-bump regions 1010 along the second face 1004 about the symmetry axis 1040. For example, micro-bumps 200 disposed in the micro-bump region $1010_1$ along the first face 1002 is symmetrical with the micro-bump region $1010_3$ along the second face 1004 such that the micro-bumps 200 coupled to similar circuitry (such as similar tiles) in adjacent rotated IC dies $1020_A$, $1020_B$ are substantially aligned. Since the micro-bumps 200 in adjacent rotated IC dies $1020_A$, $1020_B$ are substantially aligned, the metalization routings 506 between the micro-bump regions $1010_3$ and $1010_2$ on the facing faces 1002, 1004 of the adjacent IC dies $1020_A$, $1020_B$ can be routed without crossing. Furthermore, the micro-bumps 200 within each micro-bump regions $1010_3$, $1010_2$ may be staggered, such as shown in FIG. 6, so that the metalization routings 506 between adjacent IC dies $1020_A$, $1020_B$ are substantially equal in length. Additionally, the rotated orientation between IC dies 1020 allows the metalization routings 506 to be relatively short, advantageously promoting fast communication speeds between the adjacent IC dies $1020_A$, $1020_B$.

The micro-bump regions 1010₁ and 1010₄ are similarly configured to provide direct linear metalization routings 506 between adjacent IC dies 1020_A, 1020_B.

In the embodiment depicted in FIG. 10, four IC dies 1020_A, 1020_B, 1020_C, 1020_D are illustrated, each having a 90 degree rotation relative to the adjacent IC die 1020 such that the face 1002 of one IC die 1020 always faces the face 1004 of the adjacent IC die 1020. In another example, N number of adjacent IC dies 1020 have a rotation of about 360/N degrees such that the face 1002 of one IC die 1020 always faces the face 1004 of the adjacent IC die 1020.

Thus, an integrated circuit (IC) die and integrated circuit (IC) chip packages having such dies have been disclosed above that leverage the symmetry of the arrangement of micro-bumps in both an intra-die and inter-die configuration to advantageously provide improved interposer performance. Moreover, the symmetrical arrangement of intra-die and inter-die micro-bump configuration allows substantially identical rotated IC dies to be utilized in chip packages results in routing between dies, such as the CLE and VNoc tiles formed on different dies, to be routed without crossing, thereby allowing interconnects in the interposer to be fabricated with less material layers while improving the performance of communication between the rotated dies. Since the rotated dies are substantially identical, they may share a single maskset and tapeout, advantageously reducing the cost of fabrication.

While the foregoing is directed to embodiments of the present invention, other and further embodiments of the invention may be devised without departing from the basic scope thereof, and the scope thereof is determined by the claims that follow.

What is claimed is:
1. An integrated circuit (IC) die comprising:
  a die body comprising:
   a bottom exterior surface;
   a top exterior surface; and
   a front face connecting the bottom exterior surface and the top exterior surface, wherein a centerline of the die body that is perpendicular to the front face bifurcates the top exterior surface;
  a plurality of programmable tiles disposed in the die body, at least two of the programmable tiles being of a common type; and
  a plurality of micro-bumps disposed in the die body and including a set of micro-bumps coupled to the common type of programmable tiles, wherein the set of micro-bumps adjacent the front face and coupled to the common type of programmable tiles have a substantially symmetrical orientation relative to a symmetry axis, the symmetry axis being one of (a) collinear with the centerline of the die body; or (b) parallel to the centerline of the die body.
2. The IC die of claim 1, wherein the micro-bumps are arranged in a sequential order that is substantially the same as a sequential order of types of programmable tiles within the die body.
3. The IC die of claim 1, wherein the micro-bumps are arranged in a sequential order that is different than a sequential order of the programmable tiles within the die body.
4. The IC die of claim 1, wherein micro-bumps coupled to the common type of programmable tile disposed on opposite sides of the symmetry axis are equidistant from the symmetry axis.
5. The IC die of claim 4, wherein micro-bumps coupled to the common type of programmable tile disposed on opposite sides of the symmetry axis are disposed at different distances from the front face.
6. The IC die of claim 1, wherein a first group of the plurality of micro-bumps disposed proximate to the front face, coupled to different types of programmable tiles, disposed on a common side of the symmetry axis, and disposed at different distances from the front face have a first average distance from the front face; and
  wherein a second group of the plurality of micro-bumps disposed proximate to the front face, coupled to different types of programmable tiles, disposed on an opposite side of the symmetry axis relative the first group, and disposed at different distances from the front face have a second average distance from the front face that is substantially equal to the first average distance.
7. The IC die of claim 6, wherein at least a first micro-bump of the first group and at least a first micro-bump of the second group are coupled to a common type of programmable tile and are disposed at different distances from the first face.
8. The IC die of claim 7, wherein at least a second micro-bump of the first group and at least a second micro-bump of the second group are coupled to a common type of programmable tile and are disposed at a common distance from the first face.
9. The IC die of claim 1 further comprising:
  a first plurality of input/output (I/O) blocks disposed in the body proximate a first lateral side surface of the body, the first lateral side surface extending between the top and bottom exterior surfaces and coupled to the front face;
  a second plurality of I/O blocks disposed in the body proximate a second lateral side surface of the body, the second lateral side surface extending between the top and bottom exterior surfaces and coupled to the front face opposite the first lateral side surface; and
  a third plurality of I/O blocks disposed in the body proximate a back face of the body, the back face extending between the top and bottom exterior surfaces and coupled to the first and second lateral side surfaces opposite the front face.
10. A chip package assembly comprising:
  an interposer comprising:
   a top surface;
   a bottom surface disposed opposite the top surface, the bottom surface having a plurality of contact pads; and
   a plurality of interconnects disposed in the interposer;
  a first integrated circuit (IC) die mounted to the top surface of the interposer, the first IC die comprising:
   a die body;
   a plurality of programmable tiles disposed in the die body, at least two of the programmable tiles being of a common type; and
   a plurality of micro-bumps disposed in the die body, wherein micro-bumps adjacent a common face and coupled to the common type of programmable tiles have a substantially symmetrical orientation relative to a symmetry axis, the symmetry axis being one of (a) collinear with a centerline of the die body bifurcating the common face, or (b) parallel to the centerline of the die body; and
  a second IC die configured substantially identical to the first IC die and coupled to the top surface of the interposer, the second IC die mounted to the top surface of the interposer in an orientation rotated 180 degrees relative to an orientation of the first IC die, the second

IC die connected by the interconnects deposed in the interposer to the first IC die.

11. The chip package assembly of claim 10, wherein the programmable tiles of the first IC die are arranged by tile type in a palindrome orientation relative to the symmetry axis of the first IC die.

12. The chip package assembly of claim 10, wherein the second IC die comprises:
   a plurality of CLE tiles that are substantially aligned with CLE tiles comprising the programmable tiles of the first IC die; and
   a plurality of VNoc tiles that are substantially aligned with VNoc tiles comprising the programmable tiles of the first IC die.

13. The chip package assembly of claim 10, wherein the interconnects of the interposer further comprises:
   first metalization routings each coupling a first type of the programmable tiles of the first IC die with a same type of the programmable tiles of the second IC die; and
   second metalization routings each coupling a second type of programmable tiles of the first IC die that is different than the first type of programmable tiles with a same type of the programmable tiles of the second IC die, wherein the first and second metalization routings do not cross.

14. The chip package assembly of claim 10 further comprising:
   a third IC die coupled to the top surface of the interposer, the third IC configured differently than the first and second IC dies.

15. The chip package assembly of claim 10, wherein the micro-bumps of the first IC die are arranged in a sequential order that is substantially the same as a sequential order of the programmable tiles within the die body of the first IC die.

16. The chip package assembly of claim 10, wherein the micro-bumps of the first IC die are arranged in a different order than a sequential order of the programmable tiles within the die body of the first IC die.

17. The chip package assembly of claim 10, wherein micro-bumps of the first IC die coupled to the common type of programmable tiles disposed on opposite sides of the symmetry axis are equidistant from the symmetry axis.

18. The chip package assembly of claim 10, wherein micro-bumps of the first IC die coupled to the common type of programmable tiles disposed on opposite sides of the symmetry axis are disposed at different distances from the front face.

19. The chip package assembly of claim 10 further comprising:
   a third IC die coupled to the top surface of the interposer, the third IC die configured substantially identical to the first IC die.

20. The chip package assembly of claim 10 further comprising:
   a third IC die coupled to the top surface of the interposer; and
   a fourth IC die coupled to the top surface of the interposer, wherein each of the third and fourth IC dies comprise:
   a plurality of micro-bumps that are substantially aligned with the micro-bumps of the other IC dies that are coupled to a common type of programmable tile.

* * * * *